United States Patent [19]
Yonemoto

[11] Patent Number: 5,684,312
[45] Date of Patent: *Nov. 4, 1997

[54] SOLID-STATE IMAGING DEVICE HAVING CONTACT BUFFER LAYER INTERCONNECTING GATE AND VERTICAL SCAN LINE

[75] Inventor: Kazuya Yonemoto, Tokyo, Japan

[73] Assignee: Sony Corporation, Tokyo, Japan

[*] Notice: The term of this patent shall not extend beyond the expiration date of Pat. No. 5,506,434.

[21] Appl. No.: 554,771

[22] Filed: Nov. 7, 1995

Related U.S. Application Data

[63] Continuation of Ser. No. 207,425, Mar. 8, 1994, Pat. No. 5,506,434.

[30] Foreign Application Priority Data

Mar. 11, 1993 [JP] Japan ................. 5-050727

[51] Int. Cl.$^6$ ............. H01L 31/062; H01L 31/113; H01L 23/48
[52] U.S. Cl. ............. 257/291; 257/290; 257/751; 257/754; 257/756
[58] Field of Search ............. 257/290, 291, 257/751, 754, 756

[56] References Cited

U.S. PATENT DOCUMENTS

| | | |
|---|---|---|
| 4,733,286 | 3/1988 | Matsumoto . |
| 4,853,341 | 8/1989 | Nishioka et al. . |
| 4,901,129 | 2/1990 | Hycenek . |
| 5,142,346 | 8/1992 | Hycenek . |
| 5,192,988 | 3/1993 | Yoshii . |
| 5,235,195 | 8/1993 | Tran et al. . |
| 5,394,013 | 2/1995 | Oku et al. . |
| 5,506,434 | 4/1996 | Yonemoto .............. 257/291 |

*Primary Examiner*—Ngân V. Ngô
*Attorney, Agent, or Firm*—Hill, Steadman & Simpson

[57] ABSTRACT

V-shaped contact buffer layers of polycrystalline silicon are disposed between ring-shaped gate electrodes of thin-film polycrystalline silicon of amplifying pixel transistors and vertical scanning lines. The contact buffer layers and the ring-shaped gate electrodes are connected to each other by contacts, and the contact buffer layers and the vertical scanning lines are connected to each other by contacts which are positionally displaced from the above contacts. The channel length of the ring-shaped gates is rendered constant in all areas, and a potential shift is prevented from occurring in gate contacts for thereby avoiding operation characteristic degradations of the pixel transistors.

20 Claims, 10 Drawing Sheets

SOLID-STATE IMAGING DEVICE HAVING CONTACT BUFFER LAYER INTERCONNECTING GATE AND VERTICAL SCAN LINE

This is a continuation of application Ser. No. 08/207,425, filed Mar. 8, 1994, now U.S. Pat. No. 5,506,434.

BACKGROUND OF THE INVENTION

1. Field of the Invention

The present invention relates to a solid-state imaging device.

2. Description of the Related Art

FIGS. 1 through 3 of the accompanying drawings show a conventional solid-state imaging device 1.

The solid-state imaging device 1 comprises a plurality of MOS transistors as pixels (hereinafter referred to as "amplifying pixel transistors") for storing electric charges, photoelectrically converted from applied light, under gate electrodes, and modulating and amplifying drain currents with the stored electric charges.

As shown in FIG. 2, an N-type semiconductor layer 3 and a P-type well region 4 are formed on a P-type silicon semiconductor substrate 2. A ring-shaped gate electrode 6 made of thin-film polycrystalline silicon capable of transmitting light through a gate insulating film 5 of $SiO_2$ or the like is disposed over the P-type well region 4. N-type source and drain regions 7, 8 are formed, by self alignment using the gate electrode 26 as a mask, on those portions of the P-type well region 4 which correspond to the central hole and outer circumferential area of the ring-shaped gate electrode 6. The ring-shaped gate electrode 6, the source and drain regions 7, 8, and associated components jointly make up an amplifying pixel transistor 9 which serves as one pixel. A passivated film 12 is disposed on inter-layer insulating films 14 that are formed on the amplifying pixel transistor 9.

As shown in FIG. 1, a plurality of such amplifying pixel transistors 9 are arranged in a matrix form. The source regions 7 of those amplifying pixel transistors 9 which are arranged as columns are connected to vertical common signal lines 10 provided by a first layer of aluminum, and the gate electrodes 6 of those amplifying pixel transistors 9 which are arranged as rows are connected to horizontal common vertical scanning lines 11 provided by a second layer of aluminum.

Heretofore, as shown in FIGS. 1 and 3, a wide contact pad 13 extends integrally from the ring-shaped gate electrodes 6 of horizontally adjacent two of the amplifying pixel transistors 9, thereby connecting these ring-shaped gate electrodes 6 to each other. The contact pad 13 is connected to each of the vertical scanning lines 11. The source region 7 of each amplifying pixel transistor 9 and the corresponding signal line 10 are connected to a source contact 19 (see FIG. 1). Each contact pad 13 and the corresponding vertical scanning line 11 are connected to a gate contact 20.

As shown in FIG. 8, light that has passed through the ring-shaped gate electrode 6 generates electrons and holes h, and the holes h are stored as a signal charge in an $Si-SiO_2$ boundary below the ring-shaped gate electrode 6.

When a high voltage is applied through the vertical scanning line 11 to the ring-shaped gate electrode 6 to turn on the amplifying pixel transistor 9, a drain current Id flows on the surface thereof. Since the drain current Id is varied by the signal charge h stored below the ring-shaped gate electrode 6, such a change in the drain current Id is supplied as an output signal through the signal line 10.

FIG. 4 of the accompanying drawings shows the conventional floating well amplifying imager in block form. As with MOS-type imaging devices, the floating well amplifying imager shown in FIG. 4 has a vertical scanning circuit 15 and a horizontal scanning circuit 16. The vertical scanning lines 11 connected to the gates of the pixel transistors 9 are connected to the vertical scanning circuit 15. The drains of the pixel transistors 9 are connected through power supply lines 17 to a power supply terminal $t_1$.

The sources of the pixel transistors 9 are connected through horizontal switching MOS transistors 18 to an output terminal $t_2$, and the gates of the horizontal switching MOS transistors 18 are connected to the horizontal scanning circuit 16.

In synchronism with television scanning lines, the vertical scanning circuit 15 increases the potential of an Nth vertical scanning line 11, for example, to turn on all the pixel transistors 9 in a horizontal row, and the horizontal scanning circuit 16 selects, or turns on, one of the horizontal switching MOS transistors 18 to select one of the pixel transistors 9, which have been turned on, as an ith pixel in the horizontal direction. In this manner, the pixel transistors 9 are selected in synchronism with the television scanning system, and the drain currents Id of the pixel transistors 9 which have been varied by stored signal charges h are detected and supplied as an output video signal.

With the conventional solid-state imaging device shown in FIG. 1, however, because the wide contact pad 13 extends from the ring-shaped gate electrode 6 of each of the pixel transistors 9 for connection to the corresponding vertical scanning line 11, the gate electrodes 6 are partly irregular in shape. Stated otherwise, the length of the gate electrodes 6 cannot remain constant in all areas thereof.

Therefore, the signal charges h stored in the gate regions tend to concentrate in the vicinity of the contact pads 13, and are also stored in the contact pads 13, resulting in degraded pixel characteristics.

The ring-shaped gate electrodes 6 are fabricated of a thin polycrystalline silicon film in order to allow light to be transmitted therethrough. Consequently, when the ring-shaped gate electrodes 6 are brought into contact with the vertical scanning lines 11 of aluminum through the contact pads 13, the silicon and the aluminum tend to chemically react with each other thereby alloying part of the ring-shaped gate electrodes 6 through the contact pads 13. Inasmuch as the alloyed regions have a work function different from that of polycrystalline silicon, the threshold value is varied partially by the difference between the work functions, a phenomenon referred to as a "potential shift", causing characteristic deteriorations.

An impurity may be introduced by ion implantation into regions beneath the contact pads 13 to produce channel stop regions for causing the signal charges h to be stored only in the ring-shaped gate electrodes 6. However, the signal charges may be stored irregularly within the ring-shaped gate electrodes 6 because of a mask misalignment.

OBJECTS AND SUMMARY OF THE INVENTION

It is therefore an object of the present invention a solid-state imaging device which is capable of preventing a potential shift from being developed in gate contacts and of keeping the channel length of gate regions constant in all areas thereof.

According to the present invention, there is provided a solid-state imaging device comprising a pixel transistor for storing a signal charge photoelectrically converted from incident light applied thereto, the pixel transistor having gate means for applying a drive voltage to the pixel transistor, a drain connected to a power supply terminal, and a source for outputting a signal representing the signal charge, a vertical scanning line associated with the pixel transistor, and a contact buffer layer interconnecting the gate means and the vertical scanning line. The pixel transistor may comprise a MOS transistor, the gate means comprising a gate electrode. Alternatively, the pixel transistor may comprise a junction field-effect transistor including a semiconductor substrate, the gate means comprising a gate region formed in the semiconductor substrate. The contact buffer layer may be made of a material which does not chemically react with the gate means. The contact buffer layer may comprise a first joint connected to the vertical scanning line and a second joint connected to the gate means, the first and second joints being positionally displaced from each other.

According to the present invention, there is also provided a solid-state imaging device comprising a plurality of pixel transistors arranged in a matrix, for storing signal charges photoelectrically converted from incident light applied thereto, each of the pixel transistors having gate means for applying a drive voltage to the pixel transistor, a drain connected to a power supply terminal, and a source for outputting a signal representing the signal charge, a plurality of vertical scanning lines associated respective rows of pixel transistors, a plurality of vertical signal lines associated with respective columns of the pixel transistors, and connecting means for interconnecting each of the vertical scanning lines and corresponding ones of the gate means. The connecting means may comprise a layer made of an electrically conductive material which does not chemically react with the gate means. The pixel transistors may comprise respective MOS transistor, the gate means comprising respective gate electrodes. Alternatively, the pixel transistors may comprise respective junction field-effect transistors including a semiconductor substrate, the gate means comprising respective gate regions formed in the semiconductor substrate. The connecting means are arranged in a pattern such that each of the connecting means is connected to the gate means of horizontally adjacent two of the pixel transistors.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 6:
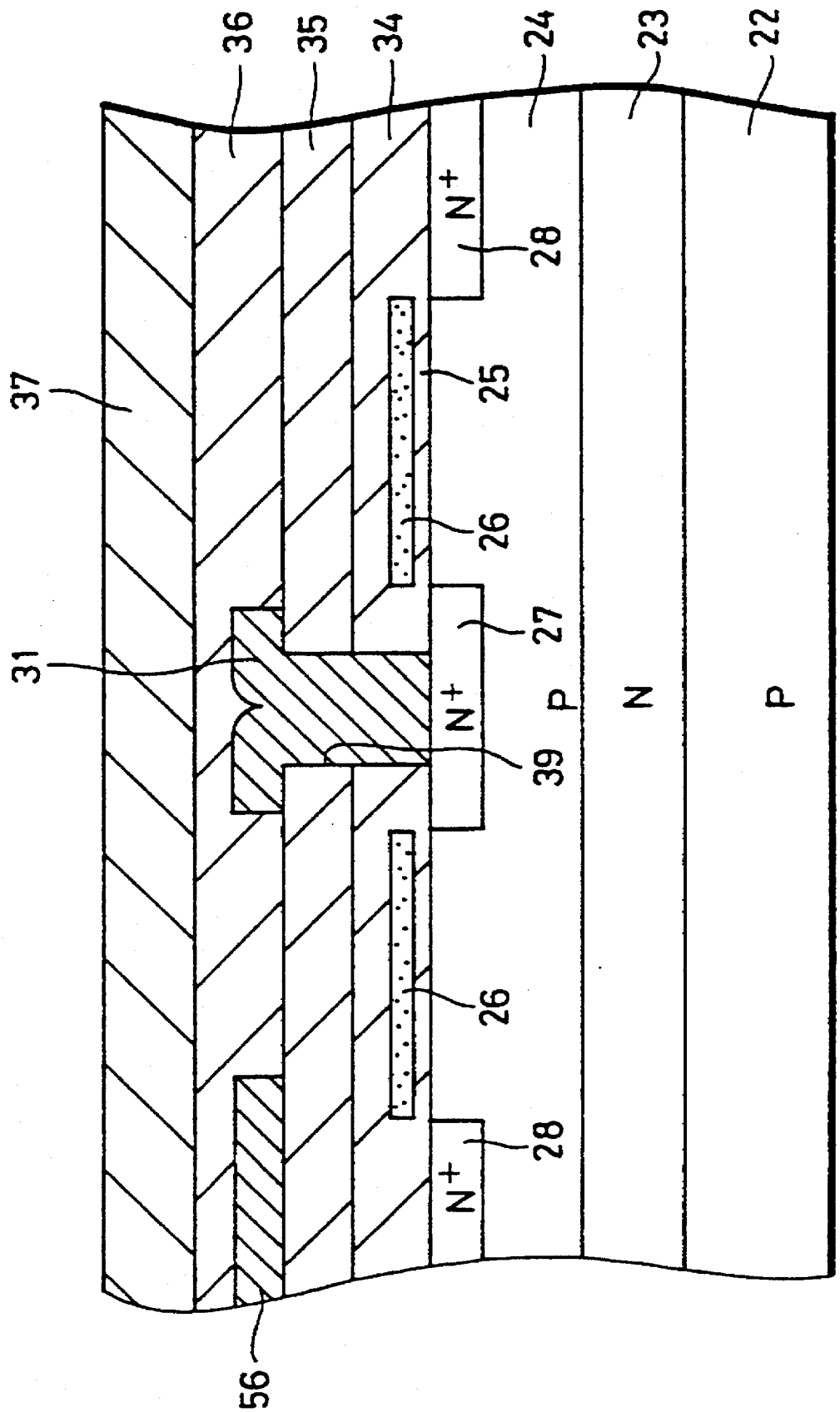
FIG. 6 is a cross-sectional view taken along line VI—VI of FIG. 5.
Figure 7:
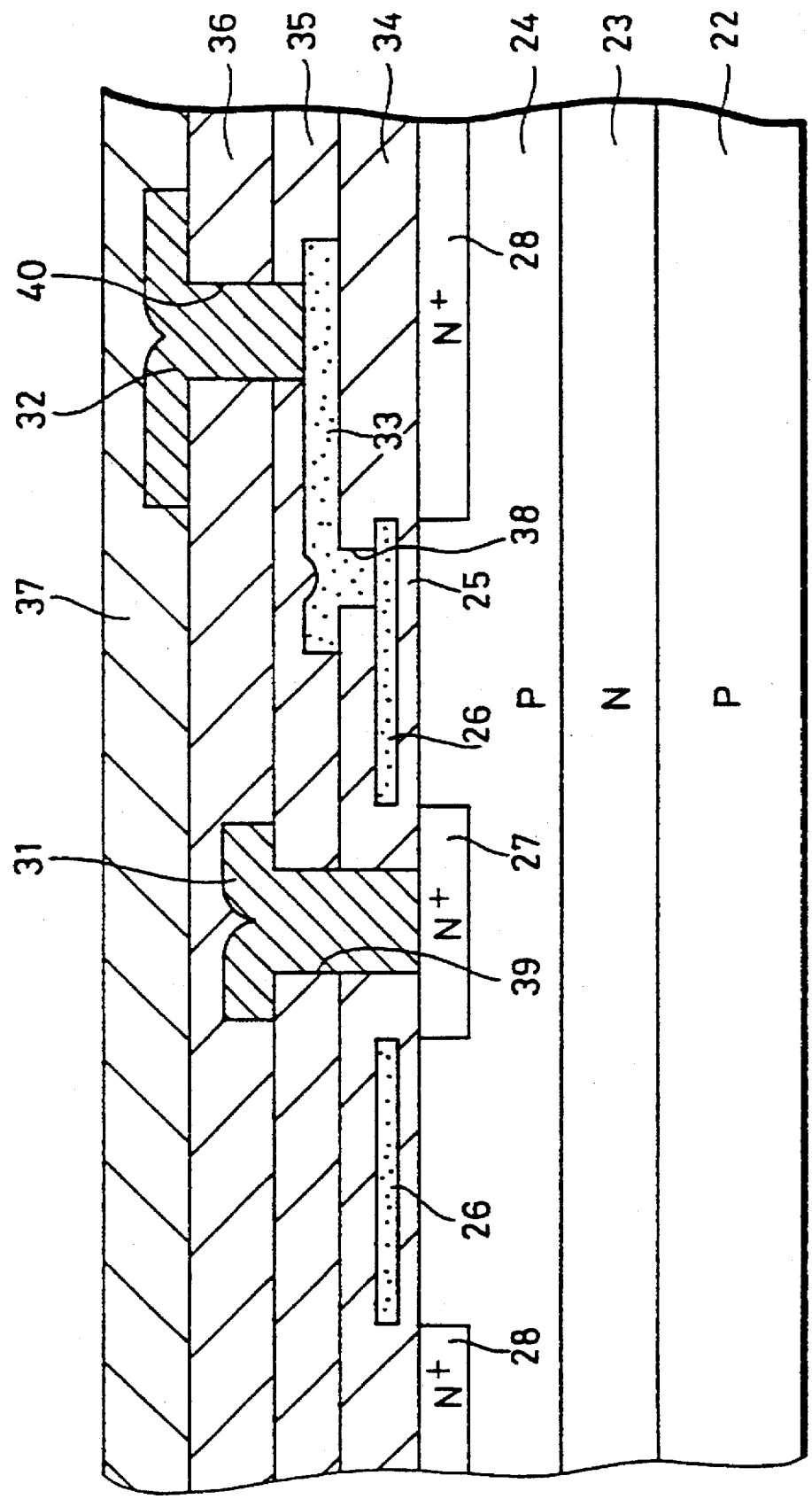
FIG. 7 is a cross-sectional view taken along line VII—VII of FIG. 5.

As shown in FIGS. 6 and 7, a solid-state imaging device 45 according to an embodiment of the present invention includes a silicon semiconductor substrate 22 of a first conductivity type, e.g., a P type, a semiconductor layer 23 of a second conductivity type, e.g., an N type, formed on the silicon semiconductor substrate 22, and a P-type well region 24 formed on the N-type semiconductor layer 23. A ring-shaped gate electrode 26 made of thin-film polycrystalline silicon capable of transmitting light through a gate insulating film 25 of $SiO_2$ or the like is disposed over the P-type well region 24. N-type source and drain regions 27, 28 are formed, by ion implantation (so-called self alignment) using the gate electrode 26 as a mask, in those portions of the P-type well region 24 which correspond to the central hole and outer circumferential area of the ring-shaped gate electrode 26. The ring-shaped gate electrode 26, the source and drain regions 27, 28, and associated components jointly make up an amplifying pixel transistor 29 comprising a MOS transistor which serves as one pixel.

Figure 1:
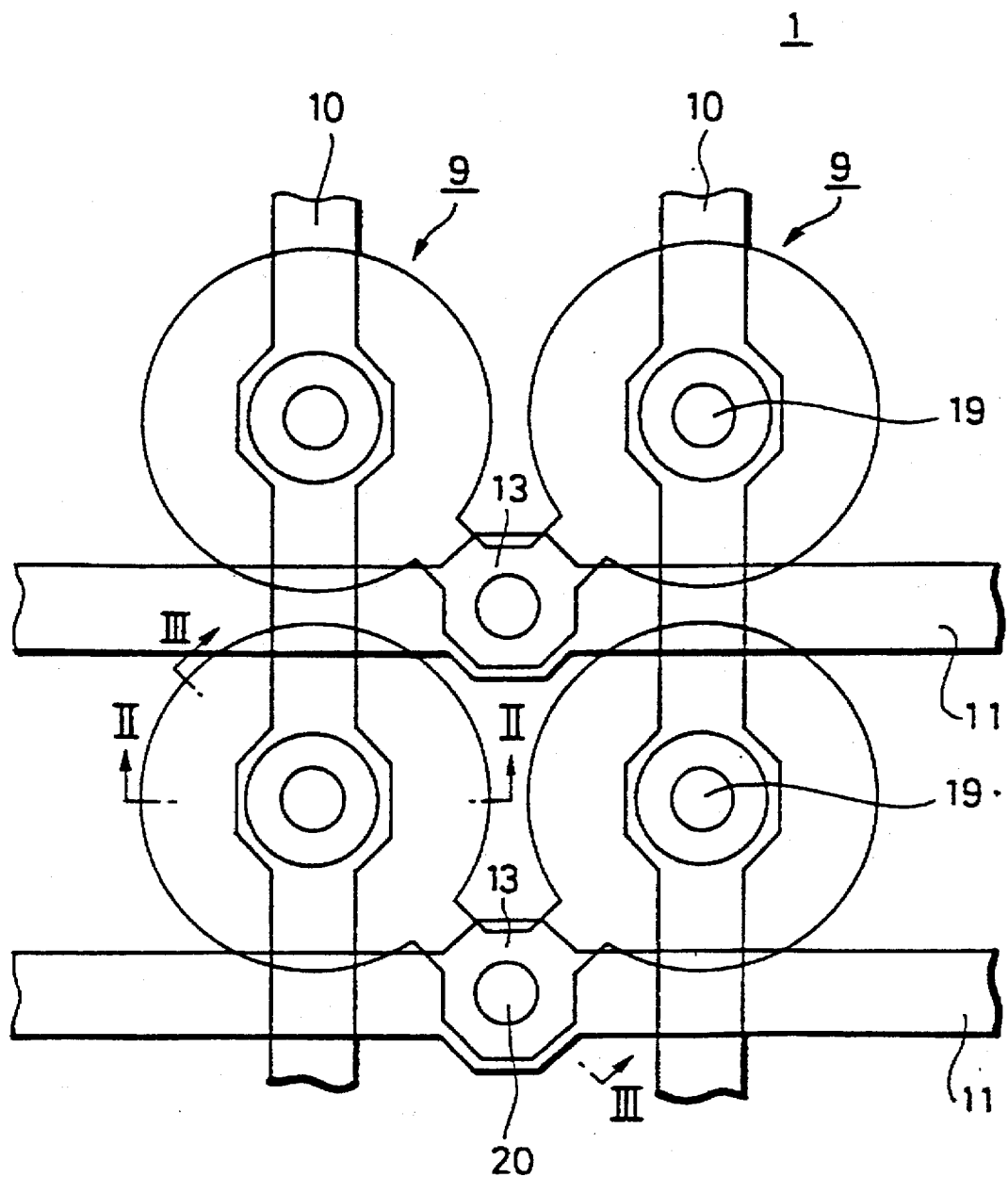
FIG. 1 is a fragmentary plan view of a conventional solid-state imaging device.
Figure 2:
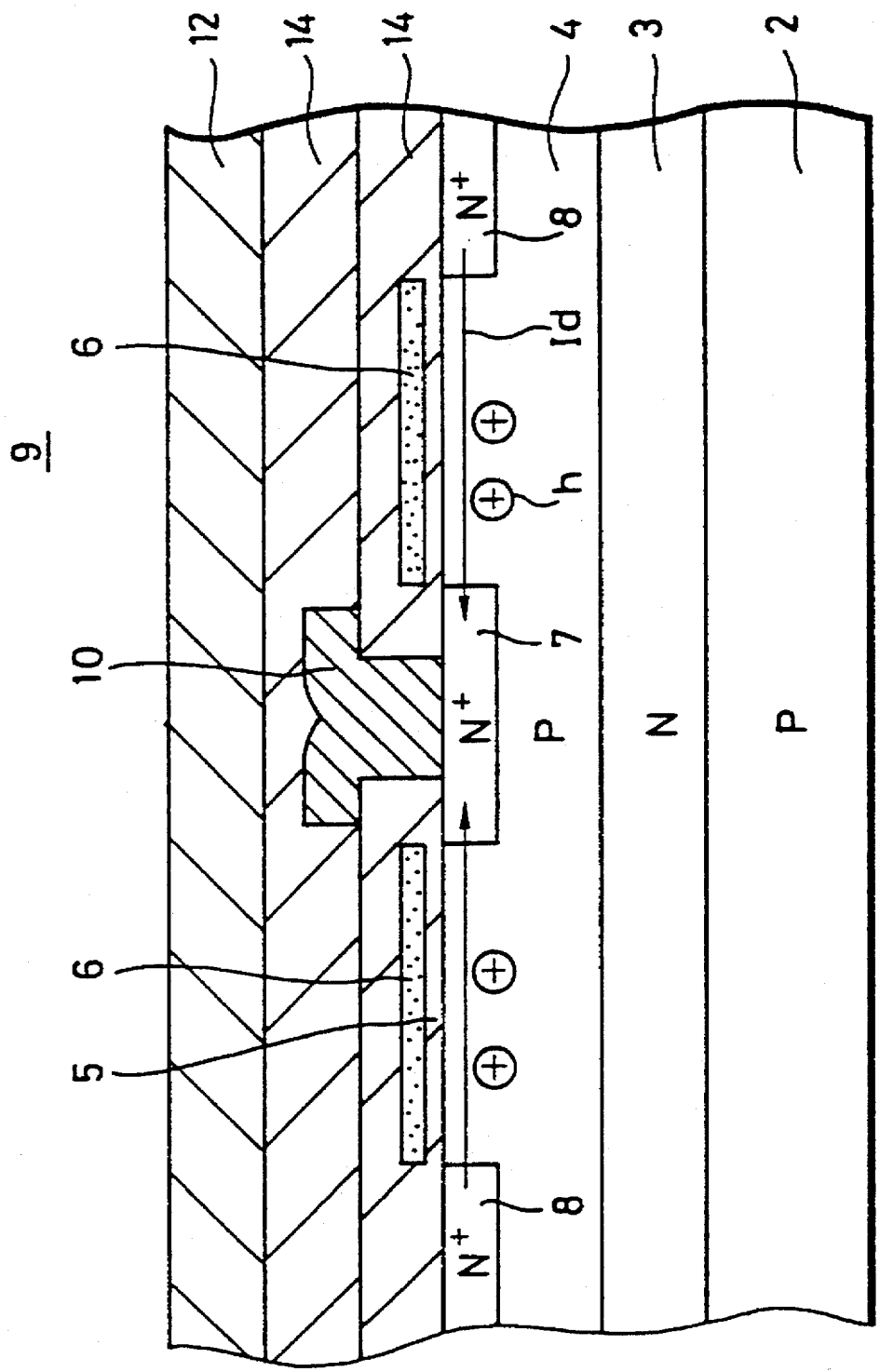
FIG. 2 is a cross-sectional view taken along line II—II of FIG. 1.
Figure 3:
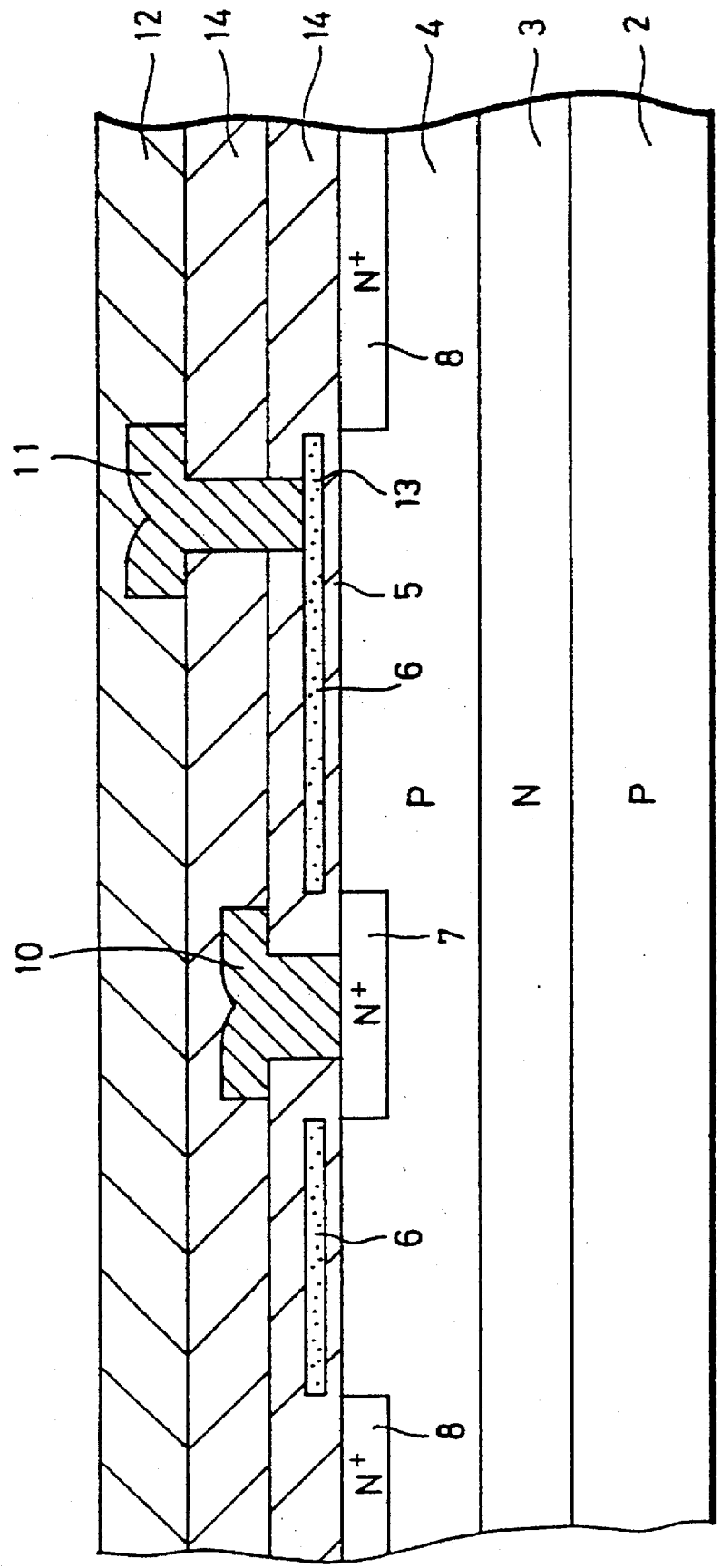
FIG. 3 is a cross-sectional view taken along line III—III of FIG. 1.
Figure 4:
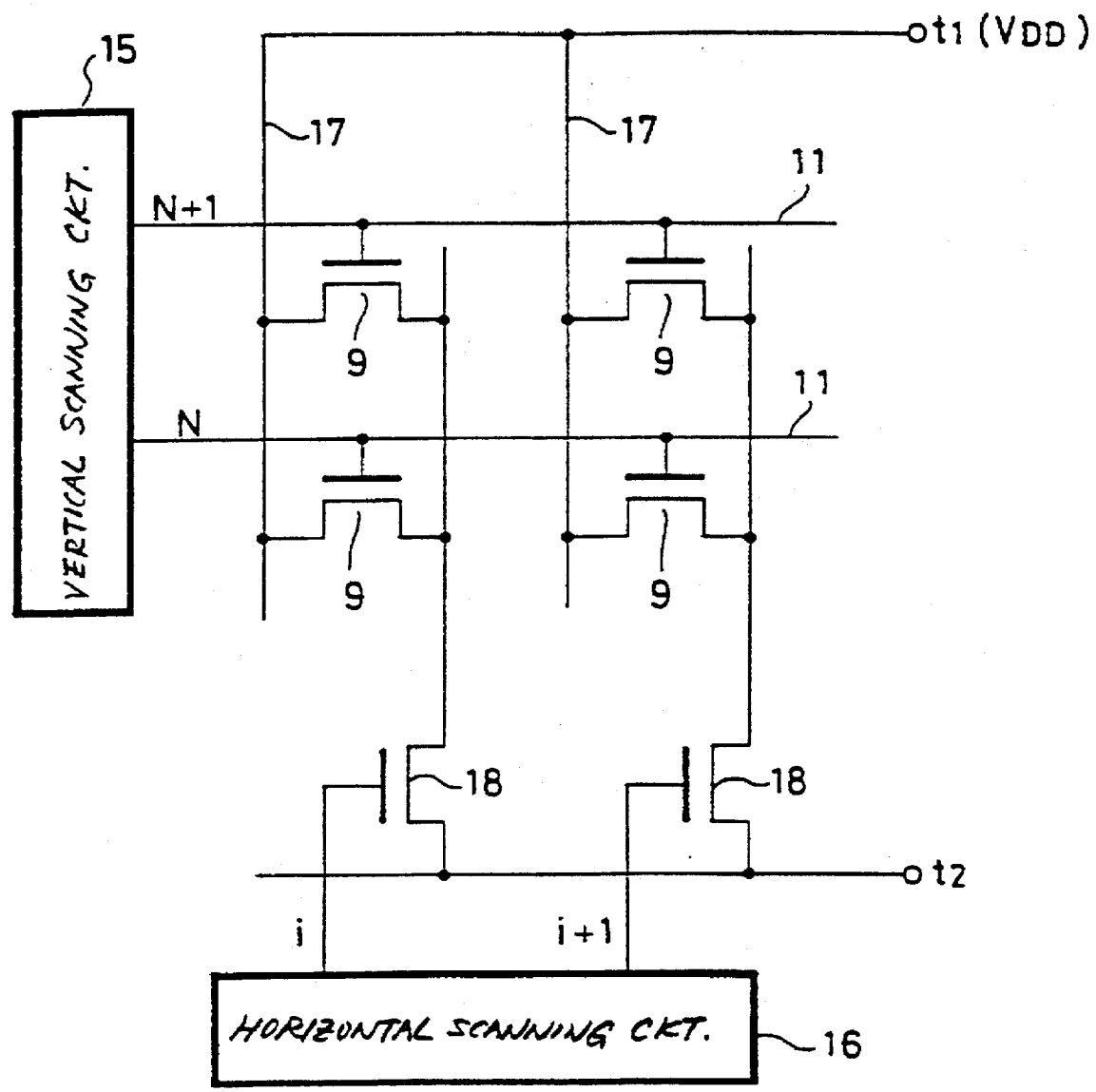
FIG. 4 is a block diagram of the conventional solid-state imaging device.
Figure 5:
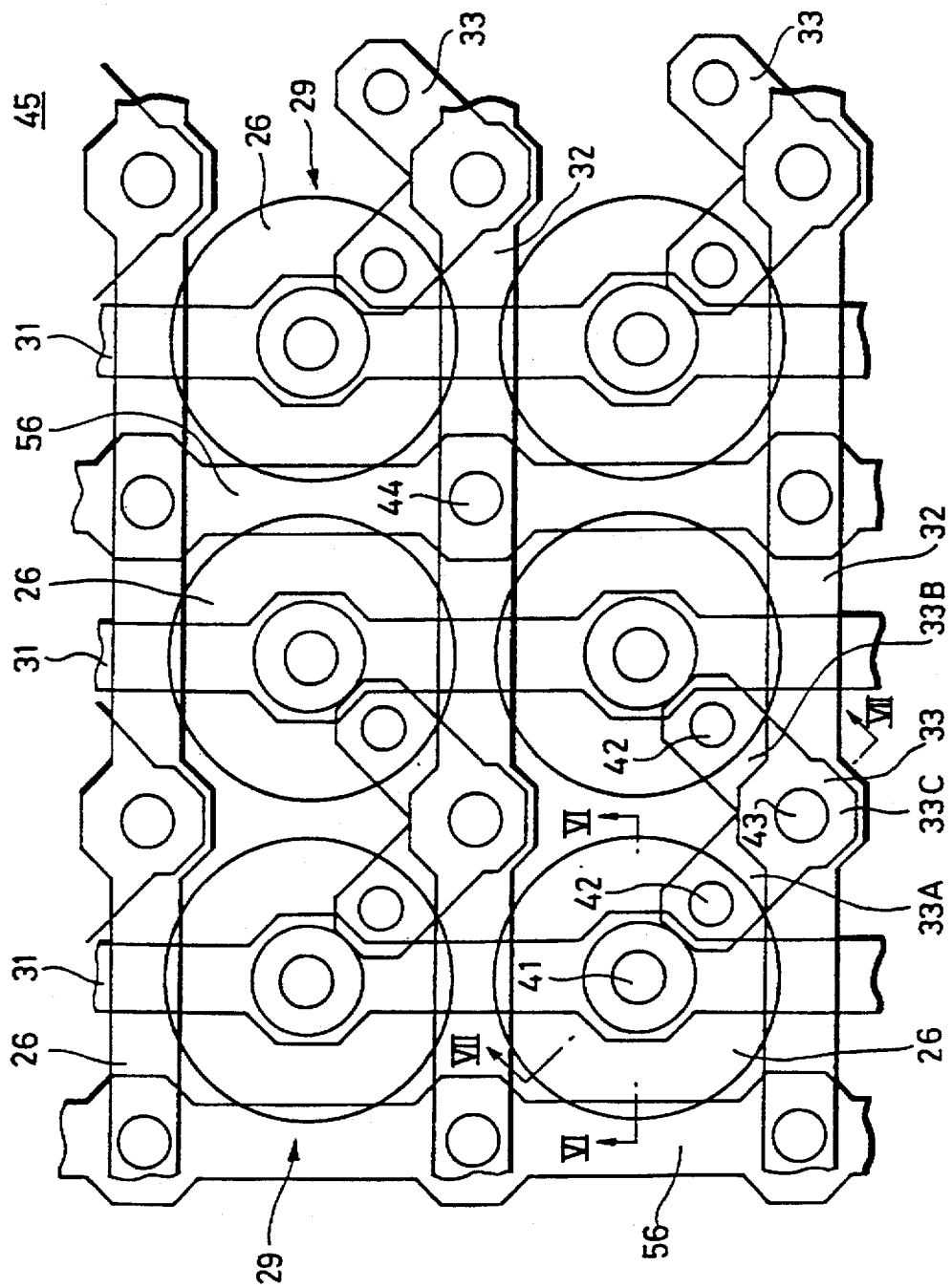
FIG. 5 is a fragmentary plan view of a floating well amplifying imager according to an embodiment of the present invention.

As shown in FIG. 5, a plurality of such amplifying pixel transistors 29 are arranged in a matrix form including vertical columns of amplifying pixel transistors 29 and horizontal rows of amplifying pixel transistors 29. The source regions 27 of the amplifying pixel transistors 9 in the vertical columns are connected to vertical signal lines 31 provided by a first layer of aluminum. Vertical scanning lines 32 provided by a second layer of aluminum extend horizontally perpendicularly to the signal lines 31 and are positioned between the rows of amplifying pixel transistors 29.

According to the embodiment shown in FIGS. 5 through 7, a V-shaped contact buffer layer 33 extends between the ring-shaped gate electrodes 26 of horizontally adjacent selected two of the amplifying pixel transistors 29, and toward and over the corresponding vertical scanning line 32. The V-shaped contact buffer layer 33 is connected to the two amplifying pixel transistors 29 and the corresponding vertical scanning line 32.

More specifically, each V-shaped contact buffer layer 33 is made of an electrically conductive material, such as polycrystalline silicon, barrier metal, or the like, which does not chemically react with the polycrystalline silicon of the ring-shaped gate electrode 26. In this embodiment, the V-shaped contact buffer layer 33 is made of polycrystalline silicon. The V-shaped contact buffer layer 33 is formed in inter-layer insulating films 34, 35 on the P-type well region 24 between the ring-shaped gate electrode 29 and the vertical scanning line 32. The V-shaped contact buffer layer 33 has first and second joints or ends 33A, 33B connected to the respective ring-shaped gate electrodes 26 of pixel transistors 29 through respective through holes, and a third joint or end 33C connected to the vertical scanning line 32.

The above structure is fabricated as follows: After the ring-shaped gate electrodes 26 are formed, the inter-layer insulating film 34 is deposited. Then, the contact buffer layers 33 are formed so as to be connected to the lower ring-shaped gate electrodes 26 through respective through holes 38. Thereafter, the inter-layer insulating film 34 is deposited, and the signal lines 31 are formed as the first layer of aluminum so as to be connected to the source regions 27 through respective through holes 39. Then, an inter-layer insulating film 36 is deposited, and the vertical scanning lines 32 are formed as the second layer of aluminum so as to be connected to the lower contact buffer layer 33 through respective through holes 40. Thereafter, a passivated layer 37 is deposited as an uppermost layer on the surface formed so far.

Drain power supply lines 56 connected to the N-type drain regions 28 are arranged between those pixel transistors 29 between which no contact buffer layers 33 are interposed. The drain power supply lines 56 may be made of a material of low resistance, e.g., the first layer of aluminum that the signal lines 31 are made of.

As shown in FIG. 5, the solid-state imaging device 45 also includes source contacts 41, gate contacts 42, buffer contacts 43, and drain contacts 44.

In the solid-state imaging device 45, the two horizontally adjacent pixel transistors 29 and the corresponding vertical scanning line 32 are electrically connected to each other by the contact buffer layer 33 which is formed between the pixel transistors 29 and the vertical scanning line 32. Therefore, signal charges are not stored below the contact buffer layer 33, but stored only below the ring-shaped gate electrodes 26. Consequently, the channel length of the ring-shaped gates is constant in all areas thereof.

As the gate contacts 42 and the buffer contacts 53 are positionally displaced from each other as shown in FIG. 5, the second layer of aluminum of the vertical scanning lines 32 and the thin polycrystalline silicon of the ring-shaped gate electrodes 26 do not chemically react each other and hence do not form an alloy. Thus, a potential shift is prevented from being developed at the gate contacts 42.

Consequently, inasmuch as the pixel transistors 29 are prevented from suffering degraded operation characteristics, the solid-state imaging device 45 is highly reliable in operation.

Furthermore, as each of the contact buffer layers 33 is of such a pattern as to extend between selected two pixel transistors 29, the drain power supply lines 36 which is made of the first layer of aluminum may be arranged between those pixel transistors 29 between which no contact buffer layers 33 are interposed.

Figure 8:
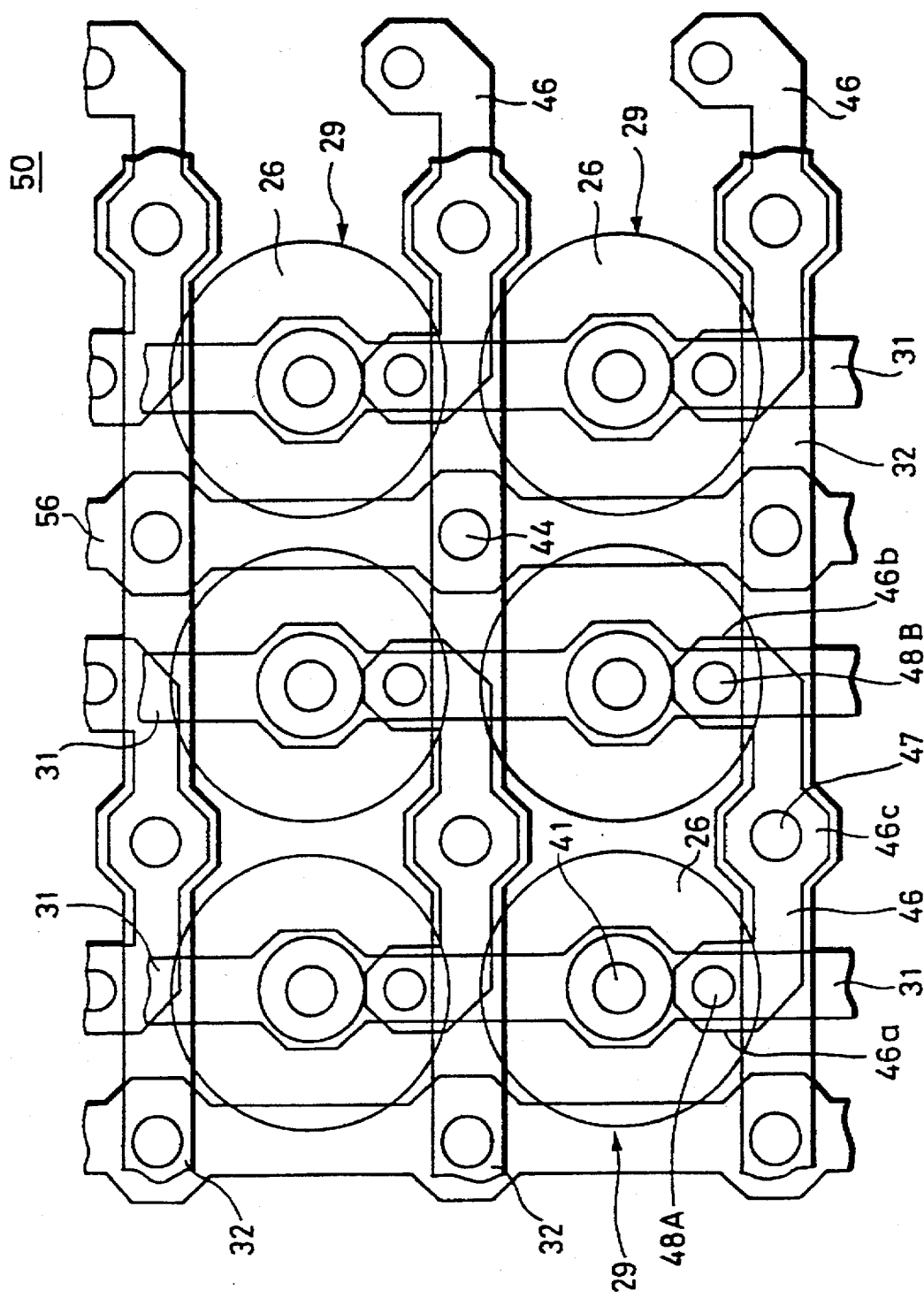
FIG. 8 is a fragmentary plan view of a solid-state imaging device according to another embodiment of the present invention.

FIG. 8 illustrates a solid-state imaging device 50 according to another embodiment of the present invention. Those parts shown in FIG. 8 which are identical to those shown in FIG. 5 are denoted by identical reference numerals, and will not be described in detail below. From a practical standpoint, the contact bugger layers 33 according to the previous embodiment are made of relatively thick polycrystalline silicon to facilitate the fabrication process. If the contact bugger layers 33 are made of relatively thick polycrystalline silicon, however, the transmittance thereof with respect to incident light is lowered thereby to reduce the substantial aperture of the floating well amplifying imager 45, which thus suffers a sensitivity reduction.

According to the embodiment shown in FIG. 8, a substantially U-shaped contact buffer layer 46 extends between the ring-shaped gate electrodes 26 of horizontally adjacent selected two of the amplifying pixel transistors 29 in superimposed relationship to the corresponding signal lines 31 and the corresponding vertical scanning line 32. The substantially U-shaped contact buffer layer 46 has a pair of free ends 46a, 46b connected respectively to the ring-shaped gate electrodes 26 of the two horizontally adjacent amplifying pixel transistors 29, and an intermediate portion 46c connected to the vertical scanning line 32. The solid-state imaging device 50 also includes buffer contacts 47 and gate contacts 48A, 48B. The other structural details of the solid-state imaging device 50 are identical to those shown in FIGS. 5 through 7.

With the solid-state imaging device 50, the contact buffer layers 46 make the channel length of the ring-shaped gates constant in all areas, and hence prevent a potential shift from occurring, so that the pixel transistors 29 are free of operation characteristic deteriorations. As the contact buffer layers 46 are superimposed on the vertical scanning lines 32 and the signal lines 31 which are made of aluminum, the contact buffer layers 36 do not block light applied to the ring-shaped gate electrodes 26 even where the contact buffer layers 36 are made of relatively thick polycrystalline silicon. Therefore, the substantial aperture of the solid-state imaging device 50 is relatively high for increased sensitivity.

Figure 9:
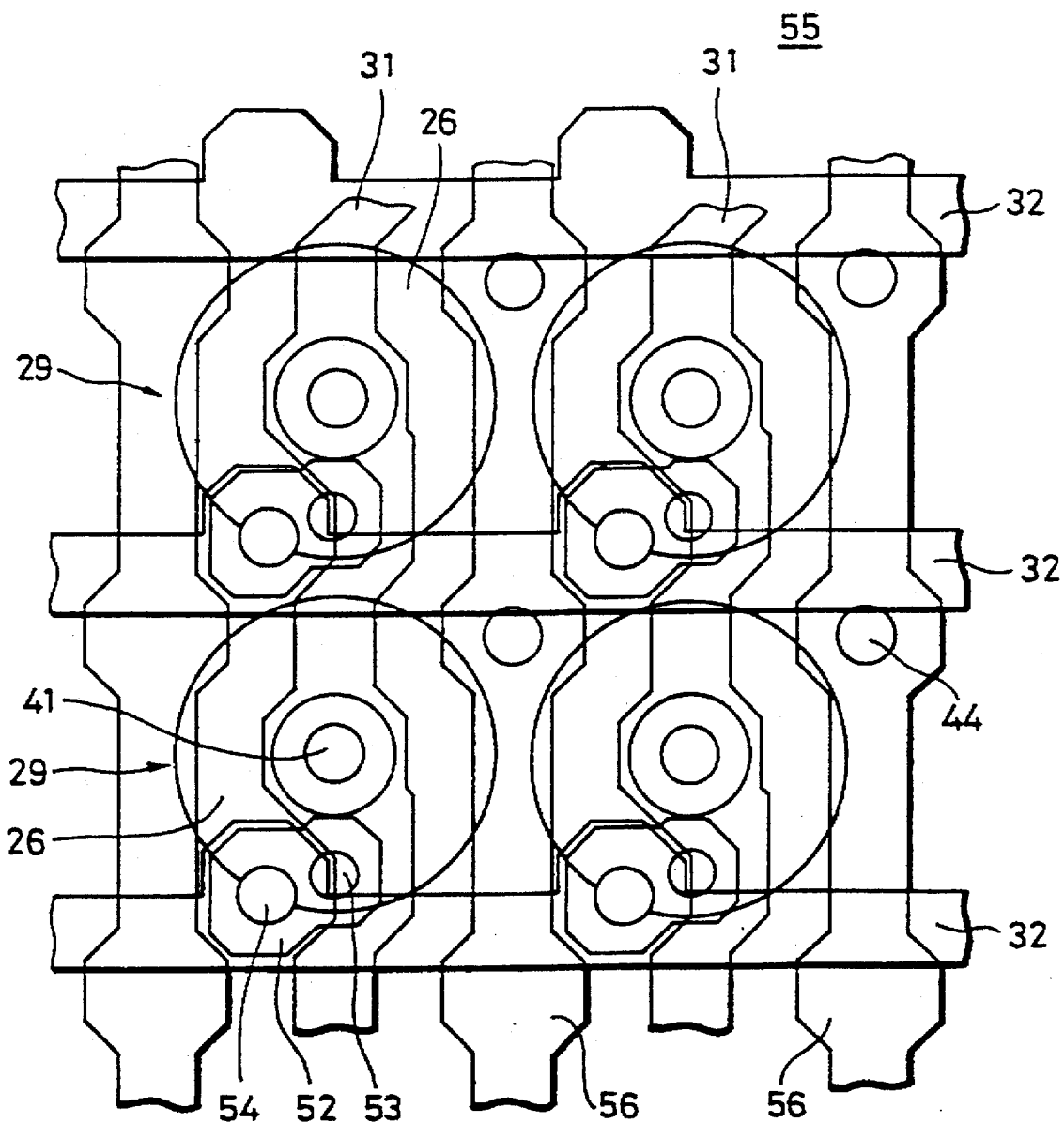
FIG. 9 is a fragmentary plan view of a solid-state imaging device according to still another embodiment of the present invention.

FIG. 9 illustrates a solid-state imaging device 55 according to still another embodiment of the present invention. Those parts shown in FIG. 9 which are identical to those shown in FIG. 5 are denoted by identical reference numerals, and will not be described in detail below.

In the embodiment shown in FIG. 9, an independent contact buffer layer 52 is formed in association with each of the pixel transistors 29, and a single drain power supply line 56 is arranged in combination with each of the columns of pixel transistors 29.

Gate contacts 53 and buffer contacts 54 are positionally displaced from each other. The contact buffer layer 52 is in the shape of two squares that are diagonally joined in overlapping relationship to each other with the gate contact 53 on one square and the buffer contact 54 on the other square.

With the solid-state imaging device 55, the contact buffer layers 52 also make the channel length of the ring-shaped gates constant in all areas, and hence prevent a potential shift from occurring, so that the pixel transistors 29 are free of operation characteristic deteriorations. Though stricter pattern rules are applied, pixels are optically separated well by the drain power supply lines 56 because the drain power supply lines 56 are combined with the respective columns of pixel transistors 29.

In the arrangements shown in FIGS. 5 through 7 and 8, no clear optical separation can be achieved between those pixels between which no drain power supply lines are interposed. If color filters are placed over the solid-state imaging device, color filters over adjacent pixels may extend over other pixels due to strict process rules for the color filters, so that the spectral characteristics of color filters may be largely varied by different color filters.

In the arrangement shown in FIG. 9, however, the pixels can optically be separated well by the drain power supply lines 56 though the aperture is slightly lowered by the drain power supply lines 56 combined with the respective columns of pixel transistors 29. Such a reduction in the aperture can be compensated for by an optical lens.

Figure 10:
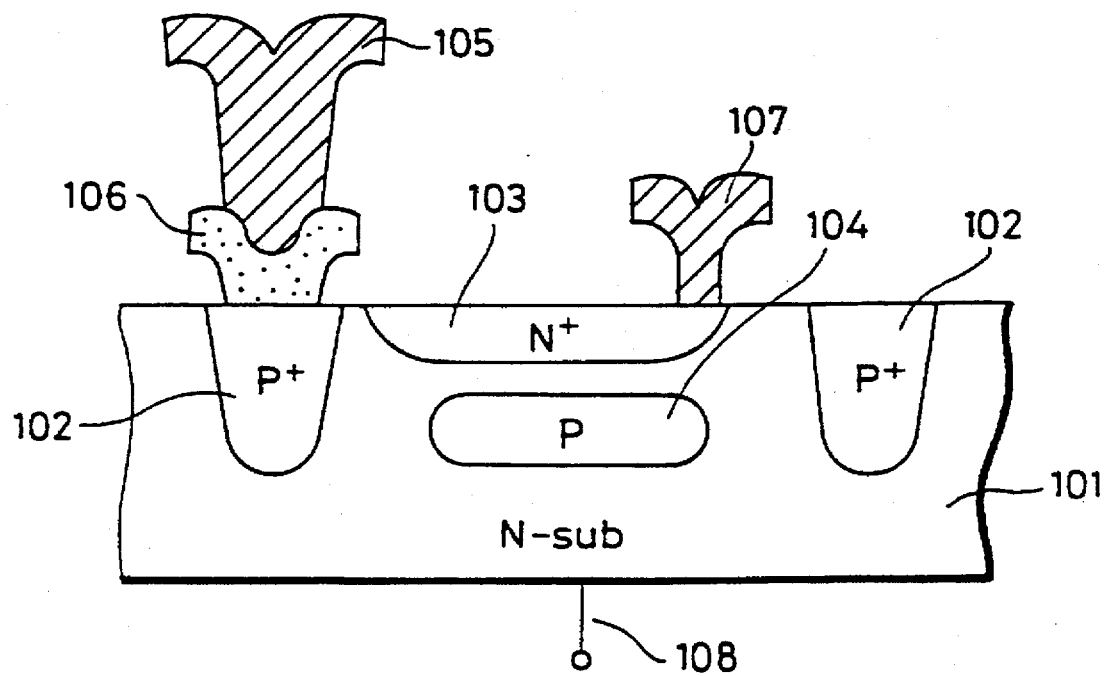
FIG. 10 is a fragmentary cross-sectional view of a solid-state imaging device according to yet still another embodiment of the present invention.

FIG. 10 shows a solid-state imaging device according to yet still another embodiment of the present invention. In FIG. 10, the solid-state imaging device comprises a matrix of pixel transistors comprising junction field-effect transistors. Fabrication of pixel transistors as junction field-effect transistors in a floating well amplifying imager is disclosed in U.S. patent application Ser. No. 08/053,433 assigned to the same assignee as the present application. As shown in FIG. 10, the solid-state imaging device comprises an N-type semiconductor substrate 101, a gate region 102, a source region 103, a sensor region 104, a vertical scanning line 105 as a first layer of aluminum, a contact buffer layer 106, a source electrode 107 as a second layer of aluminum, and a drain 108. The source region 103, which comprises an N-type impurity region, is formed on the surface of the N-type semiconductor substrate 101. The gate region 102, which comprises a P-type impurity region, is formed around the source region 103. The sensor region 104, which comprises a P-type region, is surrounded by the source region 103 and the gate region 102. The face side of the N-type semiconductor substrate 101 serves as a source, and the back side thereof as a drain 108. In such a unit pixel thus fabricated, an electric charge which has been photoelectrically converted from light is stored in the sensor region 104, thus varying the potential thereof. The potential of the sensor region 104 controls a current flowing through a channel defined between the gate region 102 and the sensor region 104. Therefore, the current flowing through the channel is varied depending on the electric charge stored in the sensor region 104, and outputted as a pixel signal. The solid-state imaging device with junction field-effect transistors as pixel transistors also includes a contact buffer layer 106 interconnecting the gate region 102 and the vertical scanning line 105. The contact buffer layer 106 is effective to prevent a potential shift from being developed in a gate contact. Furthermore, since electric contact can be achieved without defining deep contact holes, the process of fabricating the solid-state imaging device shown in FIG. 10 is simplified.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A solid-state imaging device comprising:

a semiconductor substrate having formed therein source and drain regions of a MOS transistor, said MOS transistor being a pixel transistor for storing a signal charge converted from incident light applied thereto, said drain being configured to be connected to a power supply, said source being configured for outputting a signal representing the signal charge;

first, second, third and fourth insulating interlayers formed on the semiconductor substrate in order, with the first insulating interlayer formed on the semiconductor substrate;

a transparent gate electrode of the pixel transistor formed within the first insulating interlayer, said transparent gate electrode being configured for applying a drive voltage to the pixel transistor;

a wiring line associated with said pixel transistor having a horizontal portion formed within said fourth insulating interlayer and a vertical portion extending from said fourth insulating interlayer down to said second insulating interlayer, said wiring line being horizontally displaced from the gate electrode;

a contact buffer layer electrically interconnecting the gate electrode and the wiring line, the contact buffer layer having a horizontal portion extending within said second insulating interlayer to said wiring line and having a vertical portion extending from said second insulating interlayer down to said first insulating interlayer to said gate electrode, said contact buffer made of a non-aluminum material that does not chemically react with said gate electrode.

2. The solid-state imaging device of claim 1, wherein the transparent gate electrode is a thin-film silicon electrode.

3. The solid-state imaging device of claim 1, wherein the transparent gate electrode is a thin-film polycrystalline silicon electrode.

4. The solid-state imaging device of claim 1, wherein the transparent gate electrode is ring-shaped.

5. The solid-state imaging device of claim 1, wherein at least two MOS transistors with respective gate electrodes are provided, and said contact buffer layer is V-shaped in plan view to interconnect the gate electrodes to a single vertical scan line.

6. The solid-state imaging device of claim 1, wherein at least two MOS transistors with respective gate electrodes are provided, and the contact buffer layer is U-shaped in plan view to interconnect the gate electrodes to a single vertical scan line, the contact buffer layer having three legs that define two right angles.

7. The solid-state imaging device of claim 1, wherein said contact buffer layer is made of polycrystalline silicon or a barrier metal.

8. The solid-state imaging device of claim 2, wherein said contact buffer layer is made of polycrystalline silicon or a barrier metal.

9. A solid-state imaging device comprising:

a pixel transistor for storing a signal charge photoelectrically converted from incident light applied thereto, said pixel transistor having a thin-film silicon transparent gate electrode for applying a drive voltage to the pixel transistor, a drain connected to a power supply terminal, and a source for outputting a signal representing the signal charge;

a vertical scanning line associated with said pixel transistor, said vertical scanning line being horizontally displaced from said gate electrode; and a contact buffer layer interconnecting said gate electrode and said vertical scanning line, said contact buffer layer being made of a non-aluminum material so as to not chemically react with said gate electrode.

10. The solid-state imaging device of claim 9, wherein the transparent gate electrode is a thin-film polycrystalline silicon electrode.

11. The solid-state imaging device of claim 9, wherein the transparent gate electrode is ring-shaped.

12. The solid-state imaging device of claim 9, wherein the contact buffer layer is made of polycrystalline silicon or a barrier metal.

13. A solid-stale imaging device comprising:

a plurality of pixel transistors arranged in a matrix, for storing signal charges photoelectrically converted from incident light applied thereto, each of said pixel transistors having a thin-film silicon transparent gate electrode for applying a drive voltage to the pixel transistor, a drain connected to a power supply terminal, and a source for outputting a signal representing the signal charge;

a plurality of vertical scanning lines associated with respective rows of pixel transistors, each of said vertical scanning lines being horizontally displaced from its respective gate electrode;

a plurality of vertical signal lines associated with respective columns of the pixel transistors; and connecting means for interconnecting each of said vertical scanning lines and corresponding ones of said gate electrodes, said connecting means being made of a non-aluminum material so as not to chemically react with the respective gate electrode.

14. The solid-state imaging device of claim 13, wherein the transparent gate electrode is a thin-film polycrystalline silicon electrode.

15. The solid-state imaging device of claim 13, wherein the transparent gate electrode is ring-shaped.

16. The solid-state imaging device of claim 13, wherein said connecting means is made of polycrystalline silicon or barrier metal.

17. A solid-state imaging device comprising:

a plurality of pixel transistors arranged in a matrix, for storing signal charges photoelectrically converted from incident light applied thereto, each of said pixel transistors having a transparent gate electrode for applying a drive voltage to the pixel transistor, a drain connected to a power supply terminal, and a source for outputting a signal representing the signal charge;

a plurality of vertical scanning lines associated with respective rows of said pixel transistors, each to said vertical scanning lines being horizontally displaced from its respective transparent gate electrode;

a plurality of vertical signal lines associated with respective columns of said pixel transistors; and respective connecting means for interconnecting each of said vertical scanning lines and corresponding ones of said transparent gate electrode, each of said connecting means being made of non-aluminum material so as not to chemically react with its respective transparent gate electrode, each of said connecting means being positioned between its respective vertical scanning line and vertical signal line and its transparent gate electrode.

18. The solid-state imaging device according to claim 17, wherein said gate electrodes are made of polycrystalline silicon.

19. The solid-state imaging device according to claim 18, wherein each of said connecting means is made of polycrystalline silicon.

20. The solid-state imaging device according to claim 17, wherein each of said connecting means is made of a barrier metal.

* * * * *